(12) United States Patent
Tanaka

(10) Patent No.: US 7,180,295 B2
(45) Date of Patent: Feb. 20, 2007

(54) NMR DETECTOR AND NMR SPECTROMETER EQUIPPED THEREWITH

(75) Inventor: Ryoji Tanaka, Tokyo (JP)

(73) Assignee: Jeol Ltd., Tokyo (JP)

( * ) Notice: Subject to any disclaimer, the term of this patent is extended or adjusted under 35 U.S.C. 154(b) by 8 days.

(21) Appl. No.: 11/137,858

(22) Filed: May 25, 2005

(65) Prior Publication Data
US 2006/0006869 A1 Jan. 12, 2006

(30) Foreign Application Priority Data
May 25, 2004 (JP) ............................. 2004-154401
Apr. 26, 2005 (JP) ............................. 2005-128158

(51) Int. Cl.
*G01V 3/00* (2006.01)
(52) U.S. Cl. ...................................................... 324/321
(58) Field of Classification Search ...................... None
See application file for complete search history.

(56) References Cited
U.S. PATENT DOCUMENTS

| | | | | |
|---|---|---|---|---|
| 3,038,115 A | * | 6/1962 | Mueller | 324/321 |
| 3,048,772 A | * | 8/1962 | Sannders et al. | 324/310 |
| 3,153,756 A | * | 10/1964 | Williams et al. | 324/310 |
| 3,254,212 A | * | 5/1966 | Fanning et al. | 378/53 |
| 5,247,256 A | * | 9/1993 | Marek | 324/321 |
| 5,469,061 A | * | 11/1995 | Linehan et al. | 324/321 |
| 5,552,709 A | * | 9/1996 | Anderson | 324/321 |
| 5,585,723 A | * | 12/1996 | Withers | 324/318 |
| 5,986,453 A | * | 11/1999 | Anderson et al. | 324/300 |
| 6,054,855 A | * | 4/2000 | Anderson | 324/318 |
| 6,194,900 B1 | * | 2/2001 | Freeman et al. | 324/321 |
| 6,201,392 B1 | * | 3/2001 | Anderson et al. | 324/300 |
| 6,326,787 B1 | | 12/2001 | Cowgill | |
| 6,329,820 B1 | * | 12/2001 | Hasegawa et al. | 324/315 |
| 6,917,201 B2 | * | 7/2005 | de Swiet | 324/321 |

OTHER PUBLICATIONS

Published Technical Disclosure 2004-502547 of Japan Institute of Invention and Innovation, Apr. 1, 2004 (5 pages).

* cited by examiner

*Primary Examiner*—Diego Gutierrez
*Assistant Examiner*—Dixomara Vargas
(74) *Attorney, Agent, or Firm*—The Webb Law Firm

(57) ABSTRACT

There is disclosed an NMR detector permitting NMR measurements to be performed well by making use of the merit of a meander coil if a trace amount of solution sample is investigated. Furthermore, an NMR spectrometer equipped with this detector is offered. The NMR detector comprises a planar sample cell and a planar detection coil disposed close to the sample cell. The sample cell has parallel, elongated sample spaces in connection with each other. The detection coil consists of a continuous elongated conductor repeatedly bent into segments which are substantially parallel to the sample spaces. Each of the segments has a major axis in the longitudinal direction of each of the sample spaces.

6 Claims, 10 Drawing Sheets

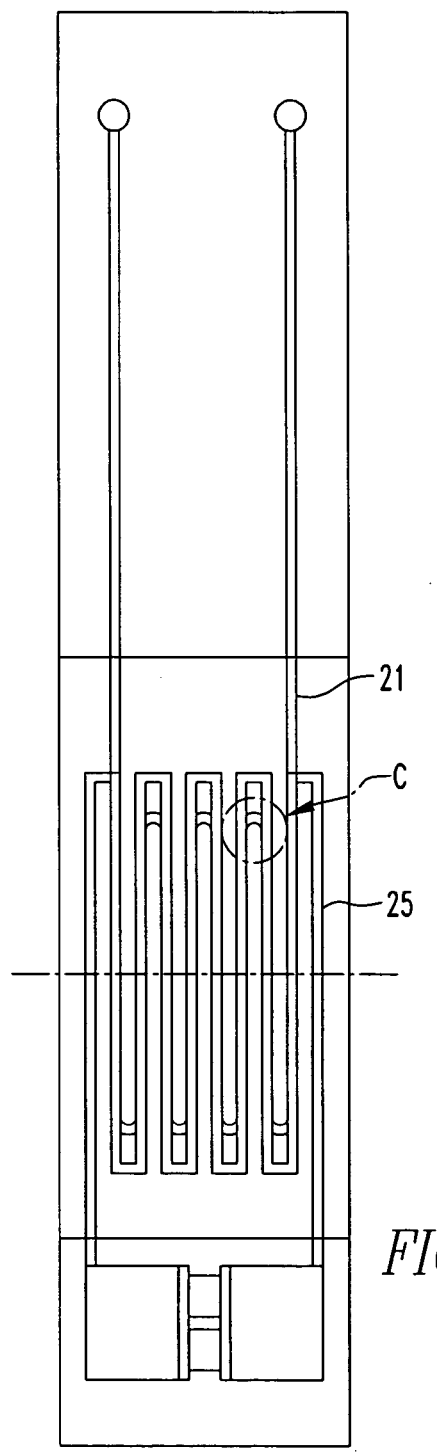
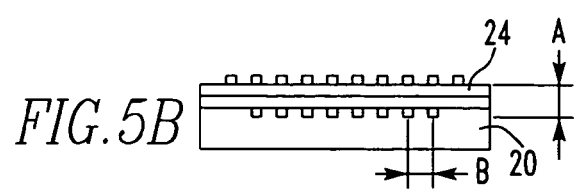
FIG.5A
FIG.5B

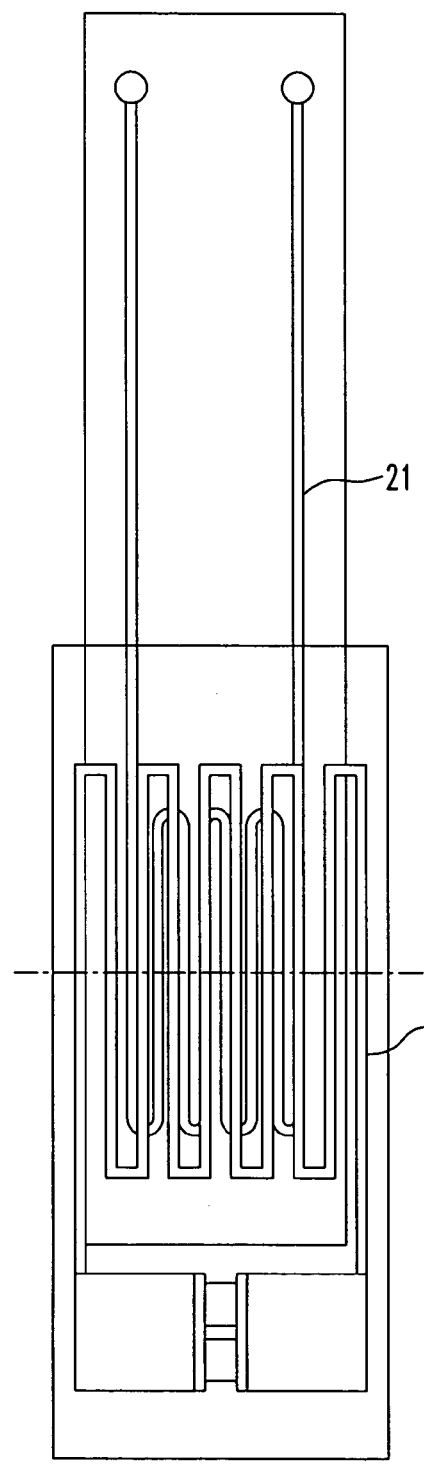
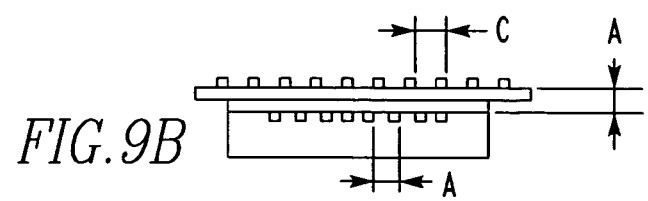
FIG.9A
FIG.9B

NMR DETECTOR AND NMR SPECTROMETER EQUIPPED THEREWITH

BACKGROUND OF THE INVENTION

1. Field of the Invention

The present invention relates to an NMR detector used in an NMR spectrometer and to an NMR spectrometer equipped with the NMR detector.

2. Description of Related Art

An NMR spectrometer is an apparatus for gaining an NMR spectrum by placing a sample under investigation within a static magnetic field, irradiating the sample with an RF pulse, and then detecting a feeble RF signal (NMR signal) emanating from the sample. The molecular structure can be analyzed by extracting molecular structural information contained in the spectrum.

FIG. 1 schematically shows the structure of an NMR spectrometer having an RF oscillator 1 emitting an RF pulse. The phase and amplitude of the RF pulse are controlled by a phase controller 2 and an amplitude controller 3 and sent to a power amplifier 4.

The RF pulse is amplified to a power necessary to excite an NMR signal by the power amplifier 4 and then sent to an NMR probe 6 via a duplexer 5. The pulse is directed at a sample under investigation (not shown) placed within the NMR probe 6. After the RF irradiation, a feeble NMR signal emanating from the sample is sent to a preamplifier 7 again via the duplexer 5 and amplified up to a signal intensity permitting reception.

A receiver 8 converts the frequency of the RF NMR signal amplified by the preamplifier 7 into an audio frequency that can be converted into a digital signal. The audio frequency of the NMR signal converted by the receiver 8 is converted into a digital signal by an analog-to-digital (A/D) converter 9 and sent to a control computer 10.

The computer 10 controls the phase controller 2 and amplitude controller 3 and Fourier-transforms the NMR signal accepted in the time domain. The computer automatically corrects the phase of the Fourier-transformed NMR signal. Then, the signal is displayed as an NMR spectrum.

FIG. 2 shows the structure of the prior art NMR detector. The NMR probe has the detector 11 in which a detection coil 13 is mounted to emit an RF pulse for exciting a sample 12 to be investigated and to detect an NMR signal emanating from the sample 12. The detection coil 13 cooperates with a tuning and matching circuit 14 to constitute an RF resonant circuit. This RF resonant circuit sends and receives RF pulses and NMR signals to and from the sample 12 contained in an NMR cell 15 placed within the probe 11. Where the sample contained in the cylindrical NMR cell is in the form of a solution, high sensitivity can be obtained by this method of measurement. However, there is the problem that where the sample assumes a planar form, high sensitivity cannot be obtained.

In recent years, an NMR detector using a meander coil has been proposed to detect an NMR signal originated from a planar sample at high sensitivity (see U.S. Pat. No. 6,326, 787). FIGS. 3A–3C show one example of an NMR detector using a meander coil. FIG. 3A is a plan view of the detector; FIG. 3B is a cross-sectional view taken in a lateral direction as indicated by the broken line in FIG. 3A; and FIG. 3C shows the direction of RF magnetic field around coil wires. In FIGS. 3A–3C, a base plate or substrate 16 forms a sample cell. The base plate 16 is made of an insulator such as a glass plate of low dielectric loss to achieve high-sensitivity NMR measurements.

A meander coil 17 consisting of an elongated conductor repeatedly bent into comb teeth-like straight segments which are regularly spaced from each other and which are uniform in length is mounted on the surface of the base plate 16. The segments at both ends of the meander coil 17 extend downward and are placed opposite to each other under the bent portions. A capacitor 18 made of a dielectric is bridged across the opposite ends. An LC resonant circuit is formed by the inductance L of the coil 17 and the capacitance C of the capacitor 18. Thus, if radio waves are injected into the meander coil 17, an RF magnetic field $B_1$ is produced across the meander coil as indicated by the arrow in FIG. 3C. An RF magnetic field $B_1$ is applied to a planar sample 19 placed on the coil 17. If a static magnetic field $B_0$ is previously applied parallel to the plane of the paper, an NMR signal from the sample 19 can be observed by interaction with the RF magnetic field $B_1$.

In the prior art, the sample space extends planarity. In the sample space, in directions crossing the meander coil, the phase of the produced RF magnetic field is rotated. Therefore, there is the problem that if the sample diffuses in a direction crossing the meander coil, the intensity of the NMR signal decreases. Especially, in a case where the spacing between the adjacent segments of the bent conductor, or meander coil, is small, this effect is conspicuous. Therefore, samples making use of the feature of the meander coil, i.e., high sensitivity to trace amounts of sample, have been limited to solid samples.

SUMMARY OF THE INVENTION

It is an object of the present invention to provide an NMR detector which makes use of the merit of a meander coil and permits good NMR measurements of even trace amounts of solution samples.

This object is achieved by an NMR detector in accordance with the present invention, the detector comprising: a planar sample cell and a planar detection coil placed close to the sample cell which has a plurality of parallel and elongated sample spaces in connection with each other. The detection coil consists of a continuous elongated conductor repeatedly bent into segments each of which has a major axis in the longitudinal direction of each sample space and is substantially parallel to the sample space.

In one feature of the present invention, the sample spaces are filled with a solution sample.

In another feature of the present invention, each of the sample cells has a substantially straight elongated portion.

In a further feature of the present invention, the parallel elongated sample spaces are connected in series with each other.

In yet another feature of the present invention, the parallel elongated sample spaces are connected in parallel with each other.

The present invention also provides an NMR spectrometer equipped with an NMR detector comprising a planar sample cell and a planar detection coil placed close to the sample cell which has a plurality of parallel and elongated sample spaces in connection with each other. The detection coil consists of a continuous elongated conductor repeatedly bent into segments each of which has a major axis in the longitudinal direction of each sample space and is substantially parallel to the sample space.

In one feature of the present invention, the sample spaces are filled with a solution sample.

In another feature of the present invention, the elongated sample cells are substantially straight.

In a further feature of the present invention, the parallel elongated sample spaces are connected in series with each other.

In yet another feature of the present invention, the parallel elongated sample spaces are connected in parallel with each other.

In the NMR detector according to the present invention, the planar sample cell having the parallel elongated sample spaces and the planar detection coil are placed in proximity to each other. The sample spaces are in connection with each other. The coil consists of the continuous elongated conductor repeatedly bent into the segments substantially parallel to the sample spaces. Each segment has a major axis in the longitudinal direction of each sample space. Therefore, if the amount of the sample contained in the solution sample is quite small, an NMR measurement can be performed well.

The NMR spectrometer according to the present invention is equipped with the NMR detector comprising the planar sample cell and the planar detection coil placed close to the sample cell which has the plurality of parallel and elongated sample spaces in connection with each other. The detection coil consists of the continuous elongated conductor repeatedly bent into the segments each of which has a major axis in the longitudinal direction of each sample space and is substantially parallel to the sample space. Therefore, if the amount of the sample contained in the solution sample is quite small, an NMR measurement can be performed well.

Other objects and features of the present invention will appear in the course of the description thereof, which follows.

BRIEF DESCRIPTION OF THE DRAWINGS

FIGS. 5A and 5B show another NMR detector according to the present invention;

FIGS. 9A and 9B show an additional NMR detector according to the present invention.

DESCRIPTION OF THE PREFERRED EMBODIMENTS

Seven embodiments of the present invention are hereinafter described with reference to the accompanying drawings.

Embodiment 1

Figure 1:
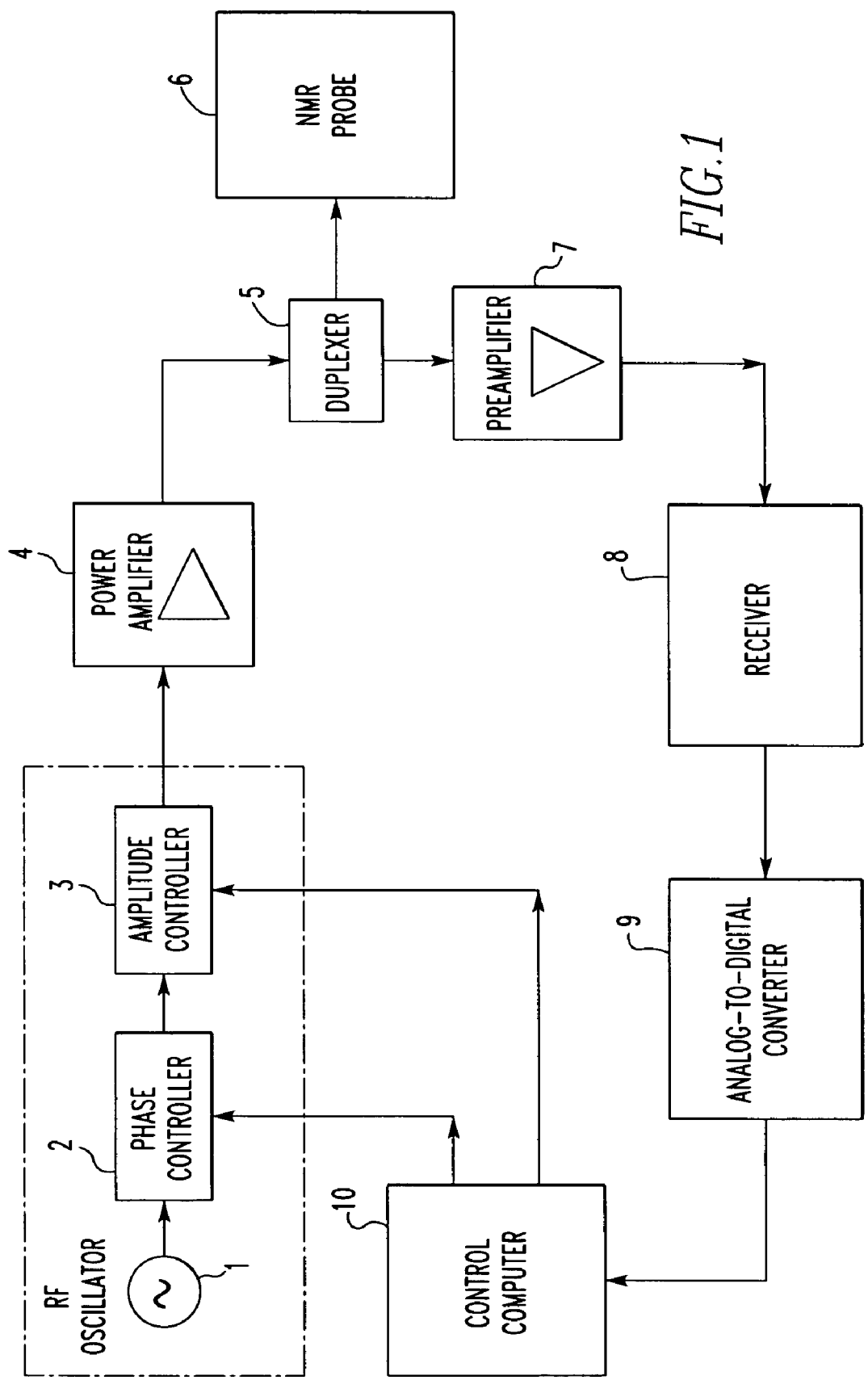
FIG. 1 is a block diagram of the prior art NMR spectrometer.
Figure 2:
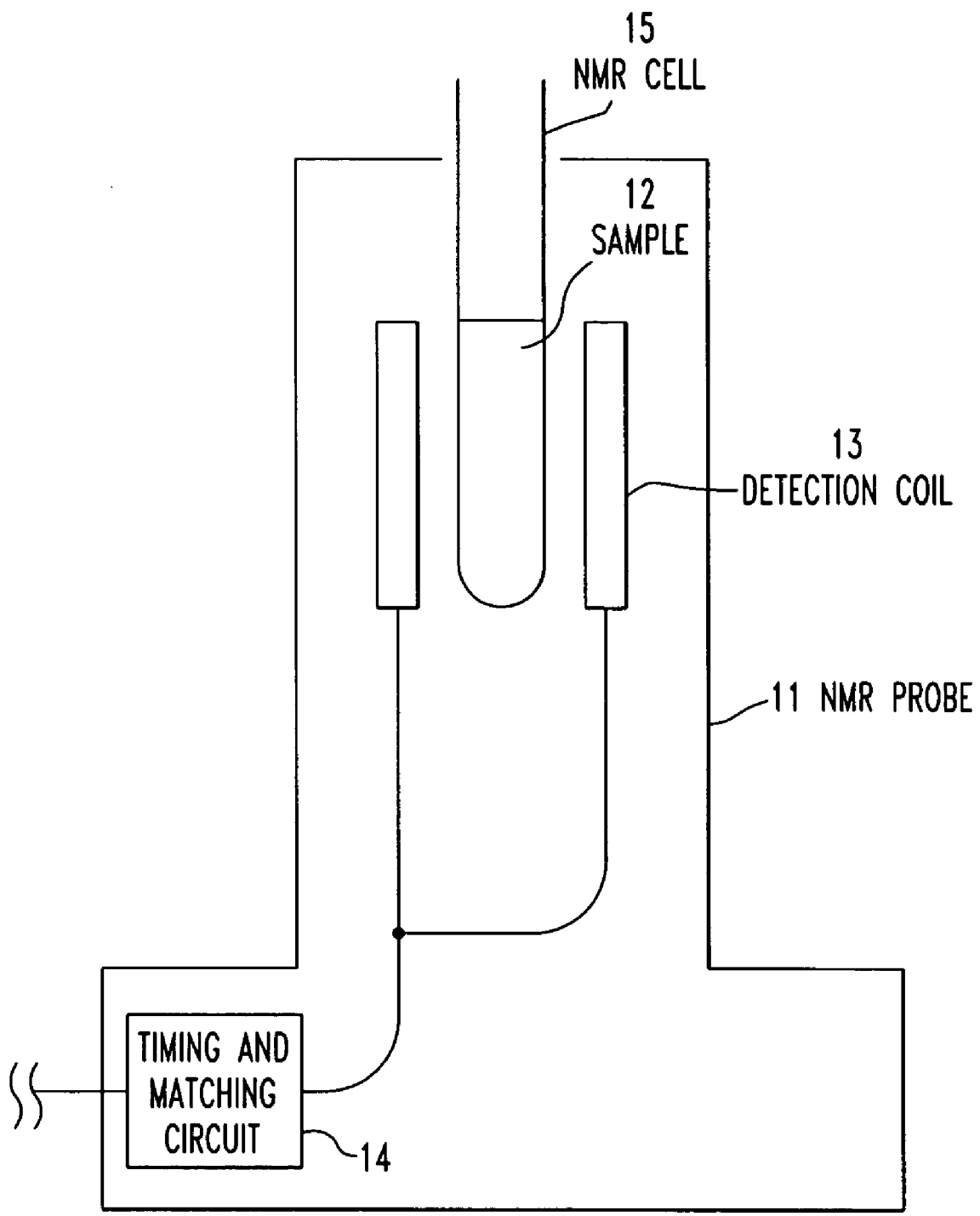
FIG. 2 is a schematic vertical cross section of the prior art NMR detector.
Figure 3A:
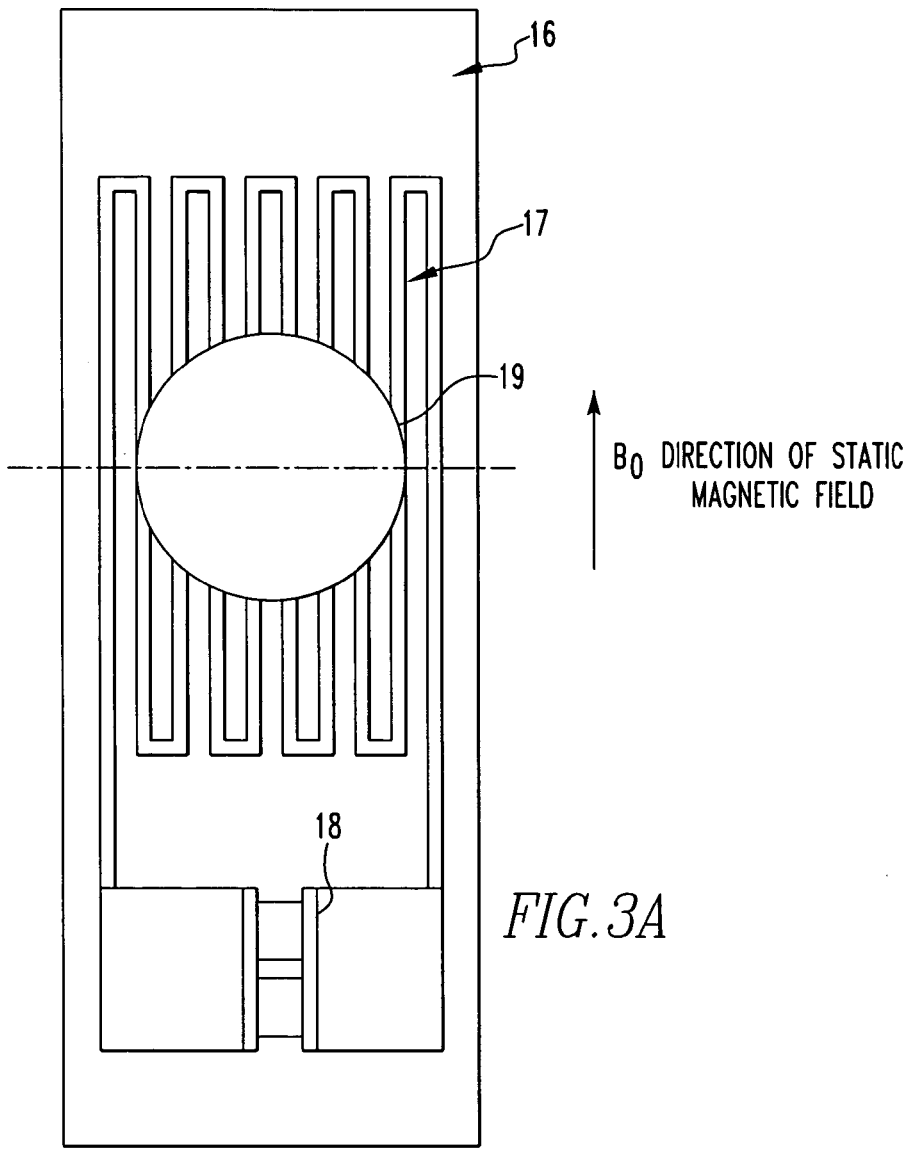
FIGS. 3A, 3B, and 3C show the prior art meander coil.
Figure 3B:
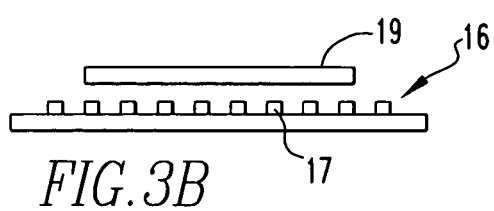
Figure 3C:
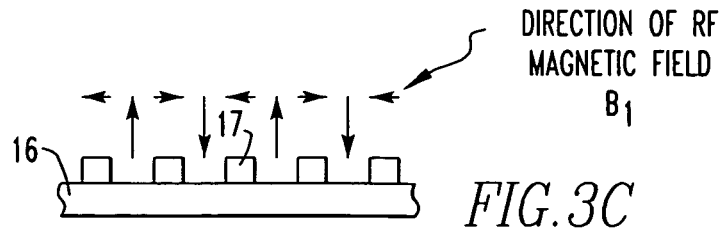
Figure 4A:
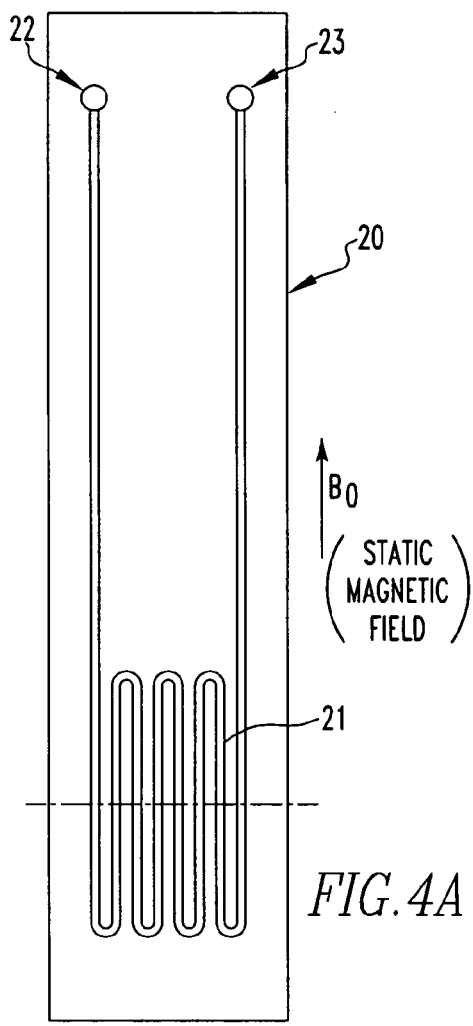
FIGS. 4A, 4B, 4C, 4D, and 4E show one NMR detector according to the present invention.
Figure 4B:
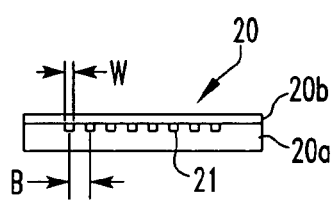
Figure 4C:
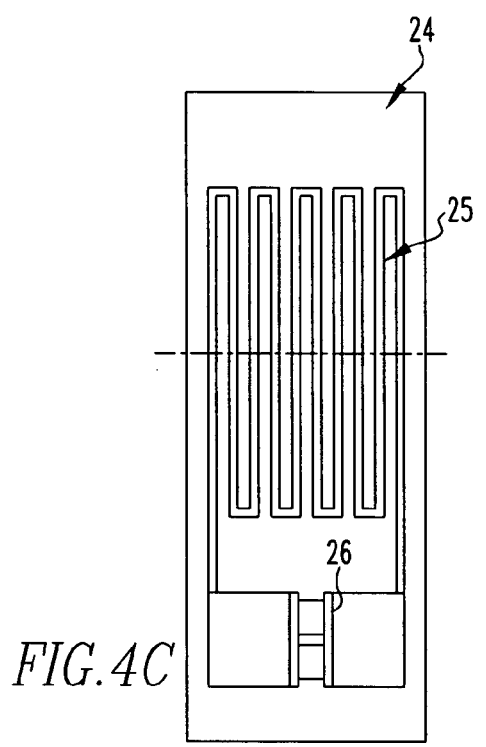
Figure 4D:
Figure 4E:
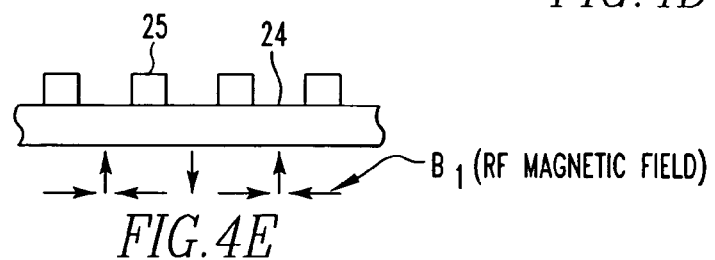

FIGS. 4A–4D show one NMR detector according to the present invention. The sample cell is shown in FIGS. 4A and 4B. The detection coil is shown in FIGS. 4C and 4D. The direction of RF magnetic field around detection coil wires is shown in of FIG. 4E. FIG. 4A is a plan view of the sample cell and FIG. 4B is a cross-sectional view taken in a lateral direction as indicated by the broken line of FIG. 4A. FIG. 4C is a plan view of the detection coil. FIG. 4D is a cross-sectional view taken in a lateral direction as indicated by the broken line of FIG. 4C. FIG. 4E is an expanded view of FIG. 4D.

In FIG. 4A, a base plate 20 forms a sample cell and is made of an insulator, such as a glass plate of low dielectric loss, to achieve high-sensitivity NMR measurements. As shown in FIG. 4B, the base plate 20 consists of two glass plates 20a and 20b bonded together. The repeatedly bent comb teeth-like meandering grooves are formed as sample spaces 21 on one glass plate 20a by a chemical etching process of the glass plate 20a. The grooves are regularly spaced from each other and uniform in length. The sample spaces 21 consist of the elongated grooves in connection with each other. The grooves are channels through which a solution sample flows. Sample ports 22 and 23 for introducing and expelling a liquid sample into and from the sample spaces 21 are formed on the other glass plate 20b. The two glass plates 20a and 20b are melted and bonded together based on a microchip fabrication method, thus forming a planar sample cell (see Published Technical Disclosure 2004-502547 of Japan Institute of Invention and Innovation).

In FIG. 4C, a base plate 24 forms the detection coil. The base plate 24 is made of an insulator, such as a glass plate of low dielectric loss, to achieve high-sensitivity NMR measurements. A planar meander coil 25 is formed on the surface of the base plate 24. The coil 25 is made of a thin metal film fabricated by sputtering of a metal. The metal film forms a continuous elongated conductor that is repeatedly bent into comb teeth-like meandering segments that are regularly spaced from each other and are uniform in length. The meander coil 25 has both end portions extending downward and placed opposite to each other under the bent portions of the conductor. A capacitor 26 made of a dielectric is bridged across the opposite ends. Thus, a planar LC resonant circuit is formed by the inductance L of the meander coil 25 and the capacitance C of the capacitor 26.

FIGS. 5A and 5B show the manner in which the base plate 20 of the sample cell and the base plate 24 of the detection coil fabricated in this way are placed in proximity to each other. In FIG. 5A is a plan view of the resulting NMR detector and FIG. 5B is a cross-sectional view taken in a lateral direction as indicated by the broken line in FIG. 5A.

The base plate 24 of the detection coil is firmly fixed within an NMR probe (not shown). On the other hand, the base plate 20 of the sample cell is inserted into the NMR probe (not shown) from outside it and placed close to the coil 25 within the NMR probe such that the meander coil 25 and sample spaces 21 are placed in a positional relationship as shown in FIGS. 5A and 5B, using a retainer tool (not shown).

As can be seen from the figure, the spacing between the sample spaces 21 formed on the base plate 20 is equal to the spacing between the adjacent segments of the meander coil 25 formed on the base plate 24. Therefore, the straight elongated portions of the sample spaces 21 are substantially parallel and exactly opposite to the straight segments of the meander coil 25. Consequently, when radio-frequency waves are injected into the meander coil 25, an RF magnetic field $B_1$ is produced across the coil as indicated by the arrow along the plane of the paper shown in of FIG. 4E. The field $B_1$ is applied to the sample cells (base plate) 20 placed on the meander coil 25. The sample spaces 21 are previously filled with a solution sample. Also, a static magnetic field $B_0$ is applied in a direction indicated by the arrow $B_0$ in of FIG.

4A. Because of the interaction with the RF field $B_1$, an NMR signal from the solution sample filled in the cells 20 can be observed.

At this time, the width W of the sample spaces taken in a direction crossing the meander coil is limited. Let B be the spacing between the adjacent segments of the meander coil in FIG. 4B. A variation in the phase of a signal due to diffusion of the sample is less than 180°×W/B. Attenuation of the signal is suppressed.

In FIG. 5B, if the distance A between the coil surface and the sample surface is set to approximately 0.8 times the spacing B between the adjacent segments of the coil, the same strength of RF magnetic field is applied also to the bends C of the sample channels. Hence, the bends act as areas detected under the same conditions (see U.S. Pat. No. 6,326,787).

The base plate 24 on which the meander coil 25 is carried can be removed from the NMR probe (not shown) according to the need. When an NMR measurement is performed in a different frequency band, the meander coil is appropriately replaced by another meander coil having frequency characteristics corresponding to the different frequency band.

Embodiment 2

Figure 6A:
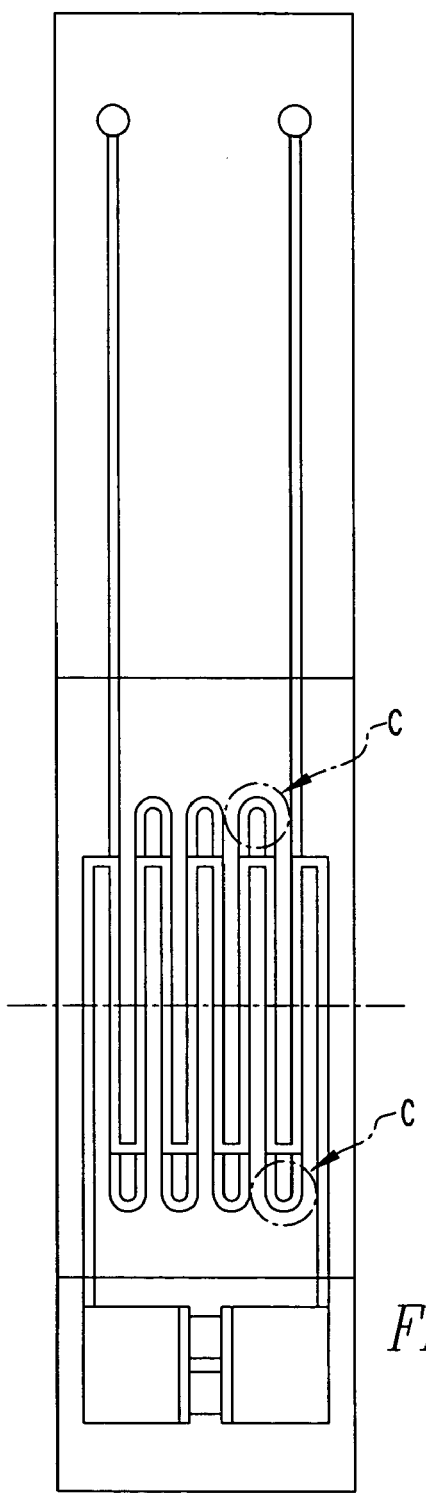
FIGS. 6A and 6B show a further NMR detector according to the present invention.
Figure 6B:
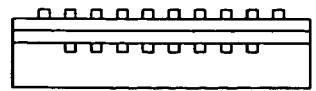
Figure 7A:
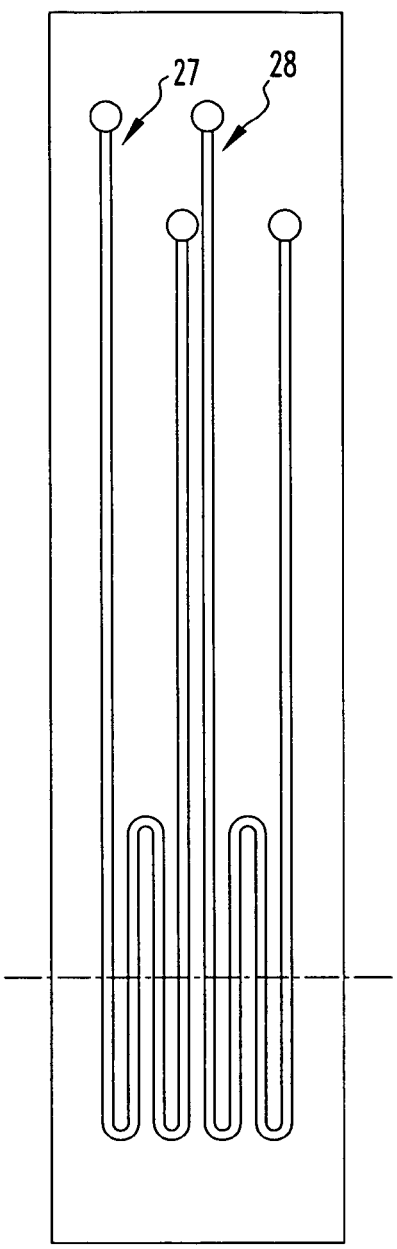
FIGS. 7A, 7B, 7C, and 7D show yet another NMR detector according to the present invention.
Figure 7B:
Figure 7C:
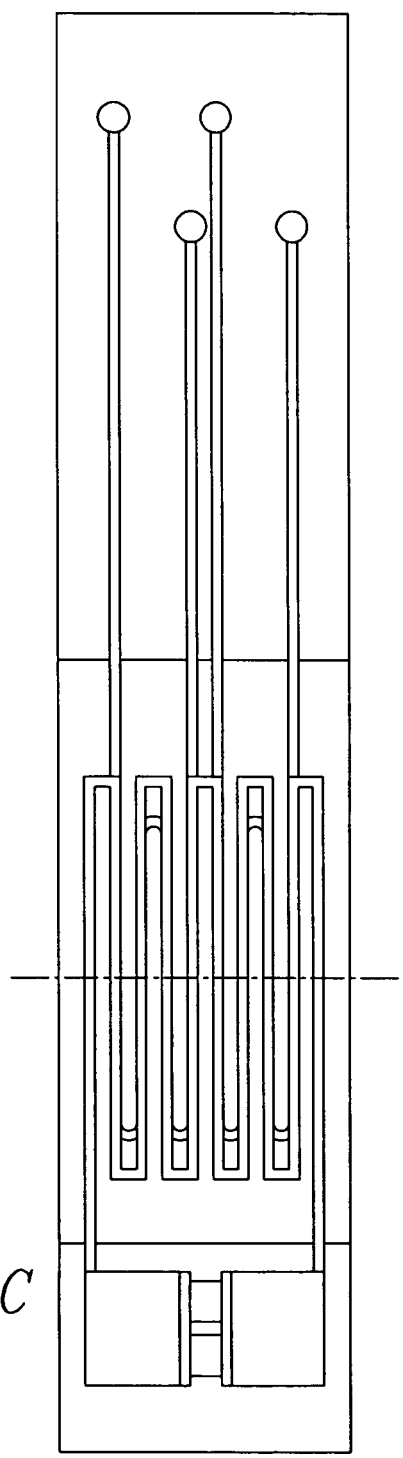
Figure 7D:
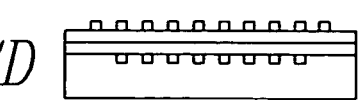

In this embodiment, a sample cell having straight segments longer than the detection coil as shown in FIGS. 6A and 6B is used. This embodiment is characterized in that the bends C of the sample channels are not contained in the NMR detection area.

Accordingly, in this structure, in the areas located outside the detection area, no NMR signal can be detected. Where there is a difference between the magnetic susceptibility of the sample and the magnetic susceptibility of the glass forming the sample cell, the homogeneity of the static magnetic field in the detection area can be enhanced by intentionally separating the bends C of the channels from the detection area. As a result, the linewidth of the NMR spectrum can be narrowed. Hence, the resolution can be improved.

Embodiment 3

In this embodiment, plural independent sample spaces through which plural samples can flow are formed in one sample cell as shown in FIGS. 7A, 7B, 7C, and 7D. This makes it possible to measure plural samples at the same time. Furthermore, plural samples can be detected in turn without the sample cell being removed from the NMR measurement portion.

This can be used in the following two ways:

(a) A first sample area 27 and a second sample area 28 are filled with different samples. Resulting NMR signals are measured at the same time.

(b) A first sample is loaded into the first sample area 27. The resulting NMR signal is measured and then the first sample is extracted. Thereafter, the position of the sample cell is shifted. A second sample is loaded into the second sample area 28. Then, the resulting NMR signal is measured.

Embodiment 4

Figure 8A:
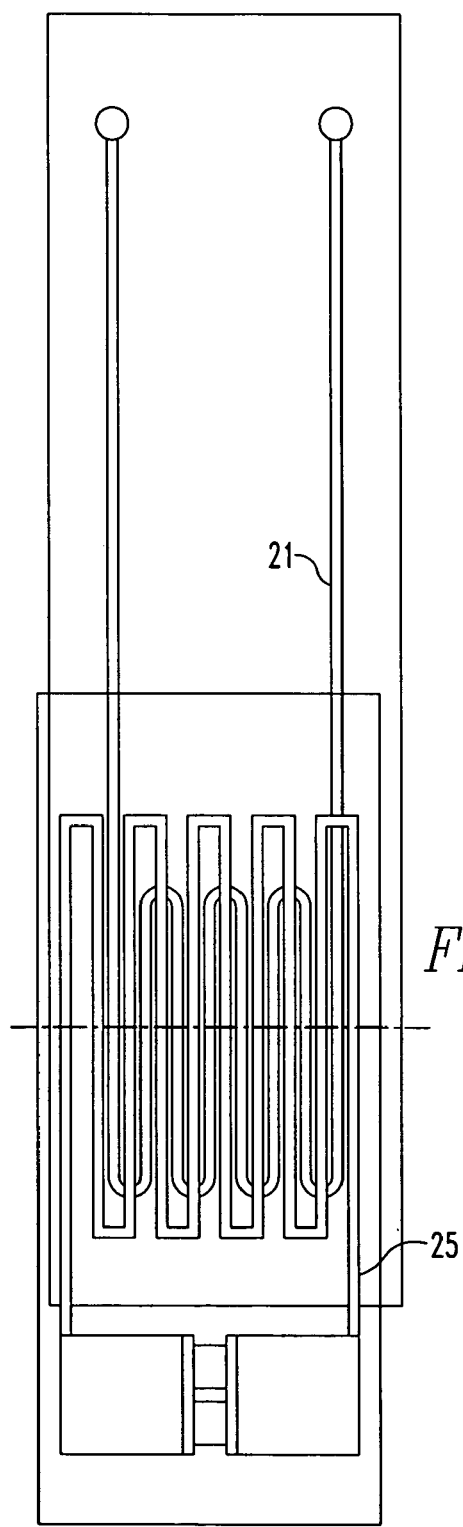
FIGS. 8A and 8B show still another NMR detector according to the present invention.
Figure 8B:
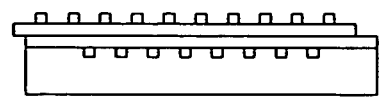

In Embodiments 1 to 3, the straight elongated portions of the sample spaces 21 are exactly opposite to the straight segments of the detection coil 25. Alternatively, the straight elongated portions of the sample spaces 21 may be staggered relative to the straight segments of the detection coil 25 as shown in FIGS. 8A and 8B.

Embodiment 5

In Embodiments 1 to 4, the spacing B between the grooves in the sample spaces 21 is equal to the spacing C between the adjacent segments of the detection coil 25. As shown in FIGS. 9A and 9B, the spacing B between the grooves in the sample spaces 21 may be different from the spacing C between the adjacent segments of the detection coil 25. In this case, the distance A between the sample space surface and the detection coil surface is set to approximately 0.8 times the spacing C between the segments of the detection coil 25. Consequently, the same strength of RF magnetic field is applied to all the sample spaces 21. It is possible that every sample space 21 acts as the same detection space.

Embodiment 6

Figure 10A:
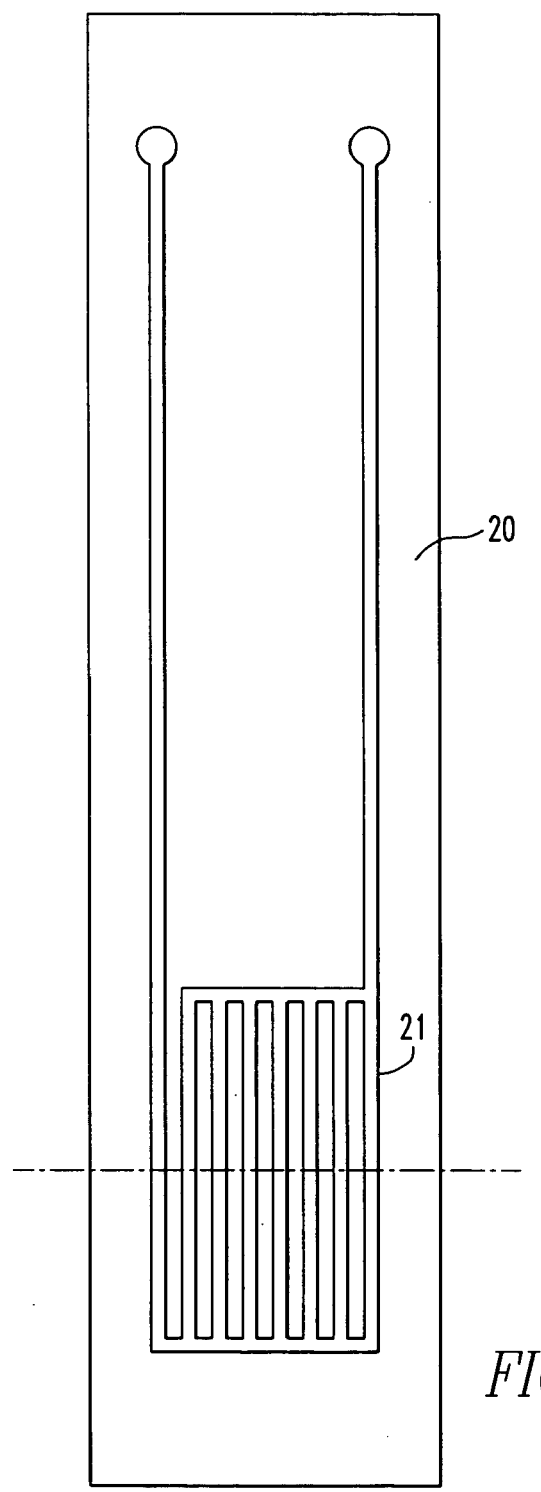
FIGS. 10A and 10B show a still further NMR detector according to the present invention.
Figure 10B:

In Embodiments 1 to 5, the plural elongated sample spaces 21 are connected in series. This meander sample cell is constructed as if one channel were repeatedly bent. The plural elongated sample spaces 21 may be connected in parallel with each other within the base plate 20 as shown in FIGS. 10A and 10B.

Embodiment 7

By incorporating an NMR detector as shown in any one of Embodiments 1 to 6 into the existing NMR spectrometer, a novel type of NMR spectrometer capable of performing NMR measurements well if the amount of sample in the solution sample is quite small can be obtained.

NMR detectors according to the present invention can be widely used in NMR instruments.

Having thus described my invention with the detail and particularity required by the Patent Laws, what is desired protected by Letters Patent is set forth in the following claims.

The invention claimed is:

1. An NMR detector comprising:
    a planar sample cell formed in a sample cell base plate having a plurality of parallel, elongated sample spaces in connection with each other, said sample spaces lying between two parallel planes, there being a pair of sample ports with a port at each end of the sample spaces for introducing and expelling liquid samples into said sample spaces; and
    a planar detection coil formed on a detection coil base plate and disposed close to the sample cell lying in a plane parallel to the planes defining the sample spaces and consisting of a continuous elongated conductor repeatedly bent into segments which are substantially parallel to said sample spaces, each of the segments having a major axis in a longitudinal direction of each of the sample spaces.

2. An NMR detector as set forth in claim 1, wherein said sample spaces are configured to hold a solution sample.

3. An NMR detector as set forth in claim 1, wherein each of said sample spaces has a substantially straight elongated portion.

4. An NMR detector as set forth in claim 1, wherein said parallel, elongated sample spaces are connected in series with each other.

5. An NMR detector as set forth in claim 1, wherein said parallel, elongated sample spaces are connected in parallel with each other.

6. An NMR spectrometer equipped with an NMR detector, said NMR detector comprising:
    a planar sample cell formed in a sample cell base plate having a plurality of parallel, elongated sample spaces in connection with each other, said sample spaces lying between two parallel planes, there being a pair of sample ports with a port at each end of the sample spaces for introducing and expelling liquid samples into said sample spaces; and a planar detection coil formed on a detection coil base plate and disposed close to the sample cell lying in a plane parallel to the planes defining the sample spaces and consisting of a continuous elongated conductor repeatedly bent into segments which are substantially parallel to said sample spaces, each of the segments having a major axis in a longitudinal direction of each of the sample spaces.

* * * * *